United States Patent
Lee et al.

(10) Patent No.: US 11,032,938 B2
(45) Date of Patent: Jun. 8, 2021

(54) TEMPERATURE CONTROL DEVICE AND CONTROL METHOD THEREOF

(71) Applicants: INVENTEC (PUDONG) TECHNOLOGY CORPORATION, Shanghai (CN); INVENTEC CORPORATION, Taipei (TW)

(72) Inventors: Cheng-Ming Lee, Taipei (TW); Kai-Yang Tung, Taipei (TW); Mao-Ching Lin, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 452 days.

(21) Appl. No.: 15/867,408

(22) Filed: Jan. 10, 2018

(65) Prior Publication Data
US 2019/0132990 A1 May 2, 2019

(30) Foreign Application Priority Data
Oct. 27, 2017 (CN) .......................... 201711021896.1

(51) Int. Cl.
| H05K 7/20 | (2006.01) |
| G01K 3/08 | (2006.01) |
| G01K 7/00 | (2006.01) |
| G05B 6/02 | (2006.01) |
| G05D 23/19 | (2006.01) |
| G05D 23/00 | (2006.01) |

(52) U.S. Cl.
CPC .......... *H05K 7/20209* (2013.01); *G01K 3/08* (2013.01); *G01K 7/00* (2013.01); *G05B 6/02* (2013.01); *G05D 23/00* (2013.01); *G05D 23/1917* (2013.01); *H05K 7/20836* (2013.01); *H05K 7/20172* (2013.01); *H05K 7/20718* (2013.01)

(58) Field of Classification Search
CPC ......... H05K 7/20209; G01K 3/08; G01K 7/00
USPC ....................................................... 700/282
See application file for complete search history.

(56) References Cited

U.S. PATENT DOCUMENTS

| 7,886,164 B1 * | 2/2011 | Alben .................... G06F 1/3203 713/300 |
| 2010/0117579 A1 * | 5/2010 | Culbert .................... G06F 1/10 318/471 |

(Continued)

*Primary Examiner* — Robert A Cassity
(74) *Attorney, Agent, or Firm* — Maschoff Brennan

(57) ABSTRACT

A temperature control device comprises a fan, a temperature sensor, a modeling circuit and a PID controller, with the PID controller connected with the fan, the temperature sensor and the modeling circuit. The fan drives airflows for controlling the temperature of a controlled region. The temperature sensor is disposed in the controlled region and obtains a detected temperature indicating the temperature of the controlled region. The modeling circuit obtains at least one cooling parameter group based on a transfer function. The PID controller controls the fan based on an initial parameter group when the detected temperature is lower than a first temperature, and controls the fan based on said at least one cooling parameter group when the detected temperature is equal to or higher than the first temperature. The initial parameter group comprises initial parameters, with the value of each of the initial parameters equal to a preset value.

9 Claims, 4 Drawing Sheets

(56) References Cited

U.S. PATENT DOCUMENTS

| | | | | |
|---|---|---|---|---|
| 2011/0132014 A1* | 6/2011 | Eisenhour | ............ | F25B 49/022 |
| | | | | 62/228.1 |
| 2012/0101648 A1* | 4/2012 | Federspiel | ......... | H05K 7/20836 |
| | | | | 700/291 |
| 2013/0073096 A1* | 3/2013 | Brey | .................. | H05K 7/20836 |
| | | | | 700/282 |
| 2014/0032011 A1* | 1/2014 | Artman | .............. | G05D 23/1931 |
| | | | | 700/300 |
| 2018/0232459 A1* | 8/2018 | Park | ....................... | G05B 15/02 |

* cited by examiner

TEMPERATURE CONTROL DEVICE AND CONTROL METHOD THEREOF

CROSS-REFERENCE TO RELATED APPLICATIONS

This non-provisional application claims priority under 35 U.S.C. § 119(a) on Patent Application No(s). 201711021896.1 filed in China on Oct. 27, 2017, the entire contents of which are hereby incorporated by reference.

BACKGROUND

Technical Field

This disclosure relates to a temperature control device, and more particularly to a temperature control device with a proportional-integral-derivative (PID) controller.

Related Art

In the server field, the conventional temperature control device often produces overcooling of the server system due to the time difference between temperature sensing and the speed control of the fan in the server system, and at the same time, the overcooling causes excessive power consumption of the fan. For reducing the power consumption of the fan, the current temperature control device introduces feedback control technology in which a proportional-integral-derivative (PID) control is the most common.

The control effectiveness of the fan is determined by the determined by the design of the control parameters of the PID controller of the fan. Conventionally, the design of these control parameters is performed by repetitive settings, experimental verification and calibration. In other words, these control parameters are obtained by the trial and error method which takes a lot of manpower and time, and the tested parameter group is usually not the most appropriate. Furthermore, the conventional PID controlled fan sets the control parameters only based on one fixed parameter group. When the values of the control parameters are fixed to be large, the speed of the fan must rapidly increase due to a considerable temperature difference in the transient response period (i.e. the period in which the temperature of the controlled region starts increasing), and then the overcooling must occur. In contrast, when the values of the control parameters are fixed to be little, the tracking effect of the transient response is not good although the rapid increase of the speed of the fan in the transient response period may be avoided. Therefore, it's difficult for the fan to enter the steady-state response period, and an overshoot easily occurs before the fan enters the steady-state response period. Furthermore, the fixed control parameters easily cause the oscillation of the speed of the fan in the transient response period.

Therefore, setting the control parameters of the PID controller only based on one fixed parameter group cannot simultaneously fit both the transient response period and the steady-state response period.

SUMMARY

According to one or more embodiments of this disclosure, a temperature control device comprises a fan, a temperature sensor, a modeling circuit and a PID controller, wherein the PID controller is connected with the fan, the temperature sensor and the modeling circuit. The fan is configured to drive airflows for controlling the temperature of a controlled region. The temperature sensor is disposed in the controlled region and configured to obtain a detected temperature, with the detected temperature indicating the temperature of the controlled region. The modeling circuit obtains at least one cooling parameter group based on a transfer function. The PID controller controls the fan based on an initial parameter group when the detected temperature is lower than a first temperature, and controls the fan based on said at least one cooling parameter group when the detected temperature is equal to or higher than the first temperature. The initial parameter group comprises a plurality of initial parameters, with the value of each of the plurality of initial parameters equal to a preset value.

According to one or more embodiments of this disclosure, a control method is applied to a temperature control device comprising a PID controller and configured to control the temperature of a controlled region. The control method comprises obtaining at least one cooling parameter group based on a transfer function; obtaining a detected temperature indicating the temperature of the controlled region; setting a plurality of control parameters of the PID controller based on an initial parameter group to control the speed of the fan when the detected temperature is less than a first temperature, with the initial parameter group comprising a plurality of initial parameters of which the quantity is equal to the quantity of the plurality of control parameters, and the value of each of the plurality of initial parameters equal to a preset value; and setting the plurality of control parameters of the PID controller based on said at least one cooling parameter group when the detected temperature is equal to or higher than the first temperature.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

This disclosure provides a temperature control device, configured to control the temperature of the controlled region to approach the threshold temperature. For example, the controlled region is a space or an electronic component, and the threshold temperature is the working temperature at which the electronic component in the controlled region or the electronic component considered as the controlled region has the best working efficiency.

Figure 1:
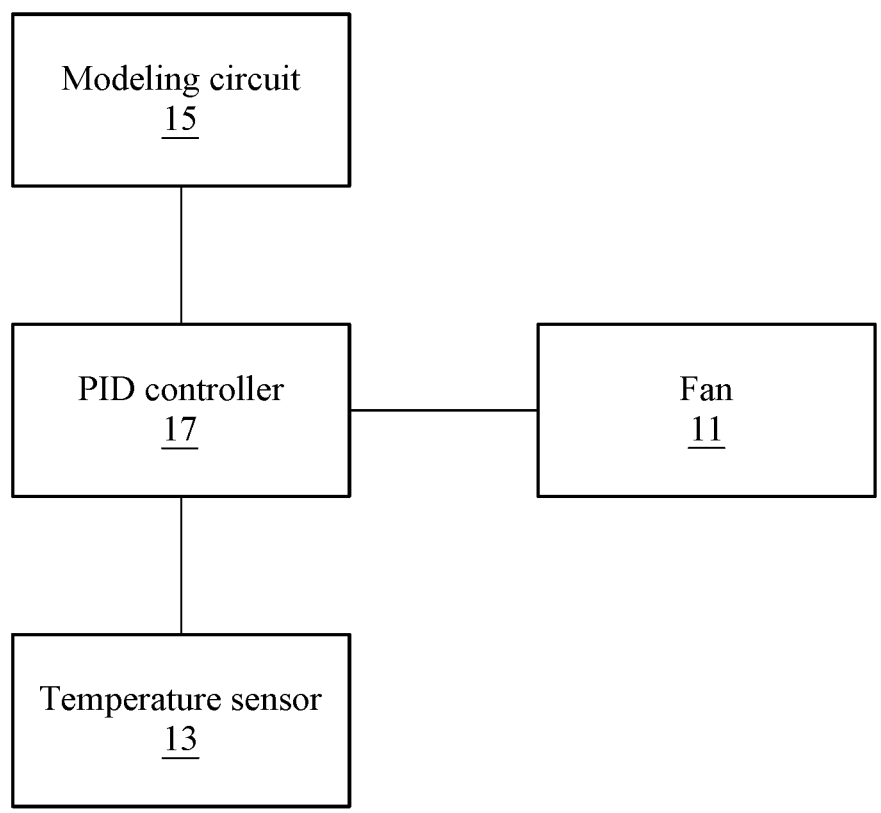
FIG. 1 is a functional block diagram of a temperature control device according to an embodiment of this disclosure.

Please refer to FIG. 1 which is a functional block diagram of a temperature control device 1 according to an embodiment of this disclosure. As shown in FIG. 1, the temperature control device 1 comprises a fan 11, a temperature sensor 13, a modeling circuit 15 and a proportional-integral-derivative (PID) controller 17, wherein the PID controller 17 is connected with the fan 11, the temperature sensor 13 and the modeling circuit 15.

The fan 11 is configured to drive airflows for controlling the temperature of the controlled region. For example, the temperature sensor 13 is a thermocouple, a thermistor, a resistance temperature detector (RTD) or an integrated circuit (IC) temperature sensor. The temperature sensor 13 is disposed in the controlled region and configured to obtain a detected temperature, with the detected temperature indicating the temperature of the controlled region. In other words, the detected temperature can be the temperature of a specific electronic component or the temperature of a space.

The modeling circuit 15, such as a chip or a microcontroller, establishes an approximate model as a transfer function based on the characteristics of the controlled region, and then obtains at least one cooling parameter group based on the transfer function. For example, the transfer function belongs to a first order plus time delay (FOPTD) function. In an embodiment, the modeling circuit 15 obtains a first parameter group based on the transfer function, with the first parameter group serving as the aforementioned cooling parameter group. In another embodiment, besides obtaining the first parameter group, the modeling circuit 15 further performs the calculation based on the first parameter group and a preset ratio to obtain a second parameter group, and both the first parameter group and the second parameter group are included in the aforementioned cooling parameter group.

The PID controller 17, such as an advanced RISC Machine (ARM) chip, generates a driving signal based on a number of control parameters to control the speed of the fan 11. The PID controller 17 controls the fan based on an initial parameter group when the detected temperature is lower than a first temperature. In other words, when the detected temperature is lower than a first temperature, the PID controller 17 sets the control parameters as the initial parameters of the initial parameter group. In contrast, when the detected temperature is equal to or higher than the first temperature, the PID controller 17 controls the fan 11 based on the first parameters calculated by the modeling circuit 15 (i.e. setting the control parameters as the parameters of the first parameter group). Moreover, in another embodiment, when the modeling circuit 15 can provide the second parameter group (i.e. the cooling parameter group includes the first and second parameter groups) and the detected temperature is equal to or higher than a second temperature, the PID controller 17 sets the control parameters as the parameters of the second parameter group, wherein the second temperature is higher than the aforementioned first temperature.

Figure 2:
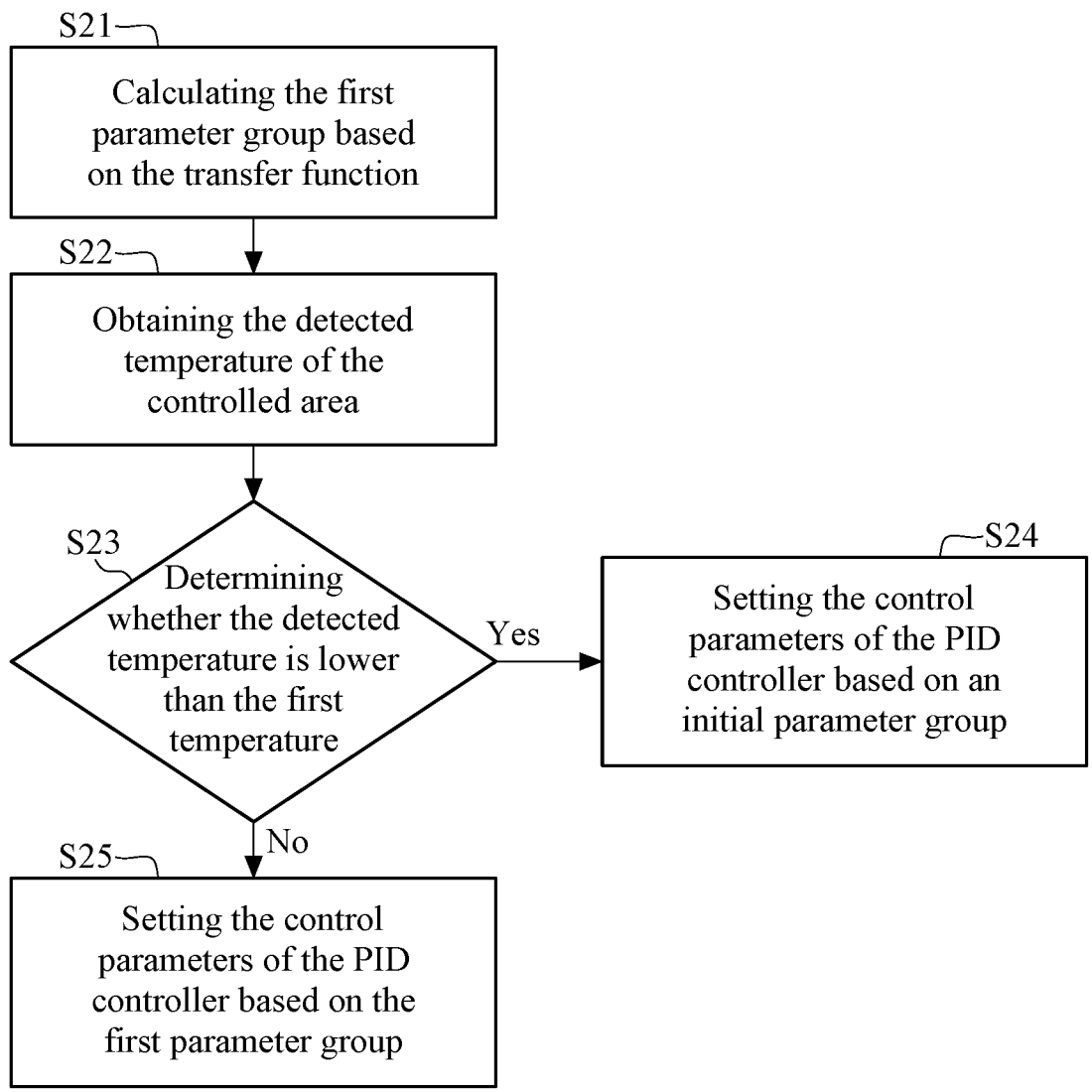
FIG. 2 is a flowchart of a control method of a temperature control device according to an embodiment of this disclosure.

In the above embodiments, both the first temperature and the second temperature are lower than the threshold temperature, and the temperature control device 1 controls the speed of the fan 11 based on a number of sets of the control parameters respectively in a number of temperature ranges which are demarcated by the first temperature and the second temperature. In the following, the control method and the operation of the temperature control device is explained. Please refer to FIG. 1 and FIG. 2, wherein FIG. 2 is a flowchart of a control method of a temperature control device according to an embodiment of this disclosure.

In step S21, the modeling circuit 15 of the temperature control device 1 performs calculation based on the transfer function to obtain a first parameter group to be a cooling parameter group comprising. The first parameter group comprises a plurality of first parameters of which the quantity is equal to that of the control parameters of the PID controller 17. As aforementioned, the PID controller 17 generates the driving signal for controlling the fan based on the plurality of control parameters comprising a proportional parameter, an integral parameter and a derivative parameter. In other words, the plurality of control parameters in the first parameter group respectively corresponds to the proportional parameter, the integral parameter and the derivative parameter.

In this embodiment, the transfer function used by the modeling circuit 15 belongs to the aforementioned FOPTD function for establishing an approximate model of the controlled region. The mathematical expression of the above transfer function is as follows:

$$G(s) = \frac{K_p e^{-Ds}}{\tau s + 1}.$$

$K_p$, D and $\tau$ respectively indicate the system gain, the time delay and the time constant. These parameters can be obtained by system identification and the first parameter group comprising the first parameters which respectively corresponds to the proportional parameter, the integral parameter and the derivative parameter is obtained by the calculation using Ziegler-Nichols (ZN) method. As a result, the cooling parameter group is obtained by the calculation of the modeling circuit 15 rather than the trial and error method which involves repetitive settings, experimental verification and calibration, so as to reduce labor and time costs.

In steps S22-S23, the temperature sensor 13 obtains the detected temperature and provides it to the PID controller 17. The PID controller 17 determines whether the detected temperature is lower than the first temperature which can be the default value pre-stored in the PID controller 17. In step S24, when the detected temperature is lower than the first temperature, the PID controller 17 sets the control parameters based on an initial parameter group comprising a plurality of initial parameters of which the quantity is equal to the quantity of the control parameters. In other words, these initial parameters respectively correspond to the proportional parameter, the integral parameter and the derivative parameter. Moreover, the values of all the initial parameters are equal to a preset value such as zero.

In an embodiment, the first temperature is 0.63 times as high as the threshold temperature. The detected temperature lower than the first temperature indicates that there is a considerable temperature difference between the threshold temperature and the environment temperature or between the threshold temperature and the component temperature. At this time, the PID controller 17 sets its control parameters to be zero or approximate zero (i.e. the initial parameter group). Therefore, the situation that the speed of the fan 11 is rapidly increased and unnecessary power consumption is generated due to the multiplication of the considerable temperature difference and each of the control parameters may be avoided.

In step S25, when the environment temperature or the component temperature is equal to or higher than the first temperature, the PID controller 17 sets its control parameters based on the first parameter group calculated by the modeling circuit 15 to generate the driving signal for controlling the fan 11.

Figure 3:
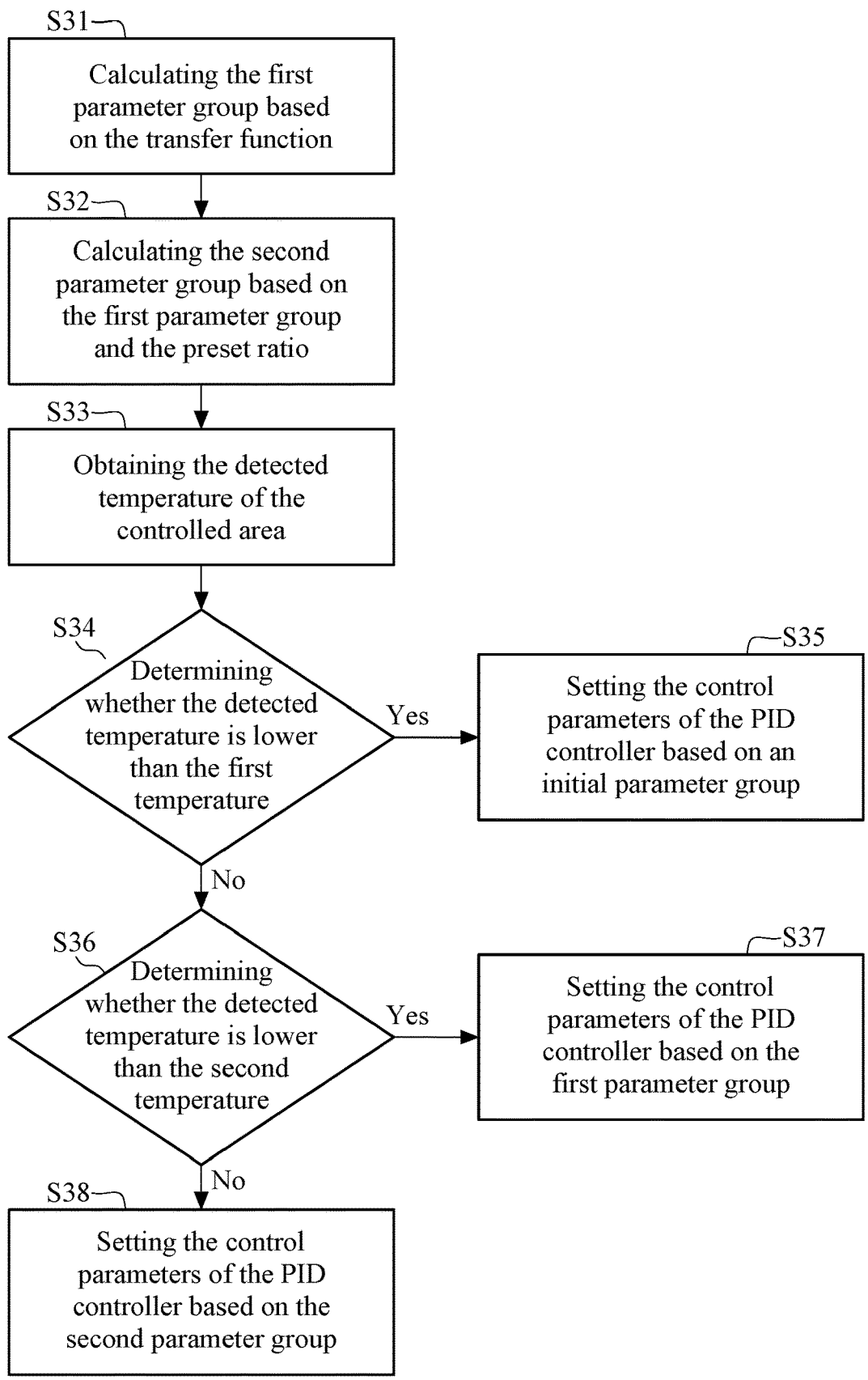
FIG. 3 is a flowchart of a control method of a temperature control device according to another embodiment of this disclosure.

The above embodiment describes the control method of the temperature control device 1 including two stages. In another embodiment, the control method of the temperature control device 1 includes three stages. Please refer to FIG. 1 and FIG. 3, wherein FIG. 3 is a flowchart of a control method of a temperature control device according to another embodiment of this disclosure.

In steps S31-S32, the modeling circuit 15 of the temperature control device 1 calculates the first parameter group based on the transfer function, and then calculates a second parameter group based on the first parameter group and a preset ratio. Both of the first parameter group and the second parameter group are considered as the cooling parameter group. In this embodiment, the steps about calculating the first parameter group based on the transfer function are similar to those in the above embodiment of FIG. 2, so the related details are not repeated. Regarding the calculation of the second parameter group, the modeling circuit 15 multiplies the first parameters in the first parameter group by the preset ratio to obtain second parameters respectively, and these second parameters form a second parameter group. In other words, the second parameter group comprises the second parameters which respectively correspond to the proportional parameter, the integral parameter and the derivative parameter. In this embodiment, the preset ratio is set to be less than 1 (e.g. ½); that is, the value of each second parameter is less than the value of the corresponding first parameter.

In steps S33-S35, the temperature sensor 13 obtains the detected temperature and provides it to the PID controller 17. The PID controller 17 then determines whether the detected temperature is lower than the first temperature. When the detected temperature is lower than the first temperature, the PID controller 17 sets the control parameters based on the initial parameter group. In this embodiment, the steps S33-S35 are similar to the steps S22-S24 in the above embodiment of FIG. 2. The PID controller 17 sets the value of each of the control parameters to be zero or approximate zero when the difference between the threshold temperature and the environment temperature or between the threshold temperature and the component temperature is considerable, so as to avoid the excessive increase of the speed of the fan 11.

In step S36, when the PID controller 17 determines that the detected temperature is equal to or higher than the first temperature, and then determines whether the detected temperature is lower than a second temperature. The second temperature is a default value pre-stored in the PID controller 17, such as 97% of the threshold temperature. When the detected temperature is equal to or higher than the first temperature and lower than the second temperature, there is quite a little difference between the detected temperature and the threshold temperature. At this time, the PID controller 17 sets the control parameters based on the first parameter group, as described in step S37. In contrast, when the detected temperature is equal to or higher than the second temperature, the detected temperature approaches the threshold temperature, and at this time, the PID controller 17 sets the control parameters based on the second parameter group to control the speed of the fan 11, as described in S38.

Figure 4:
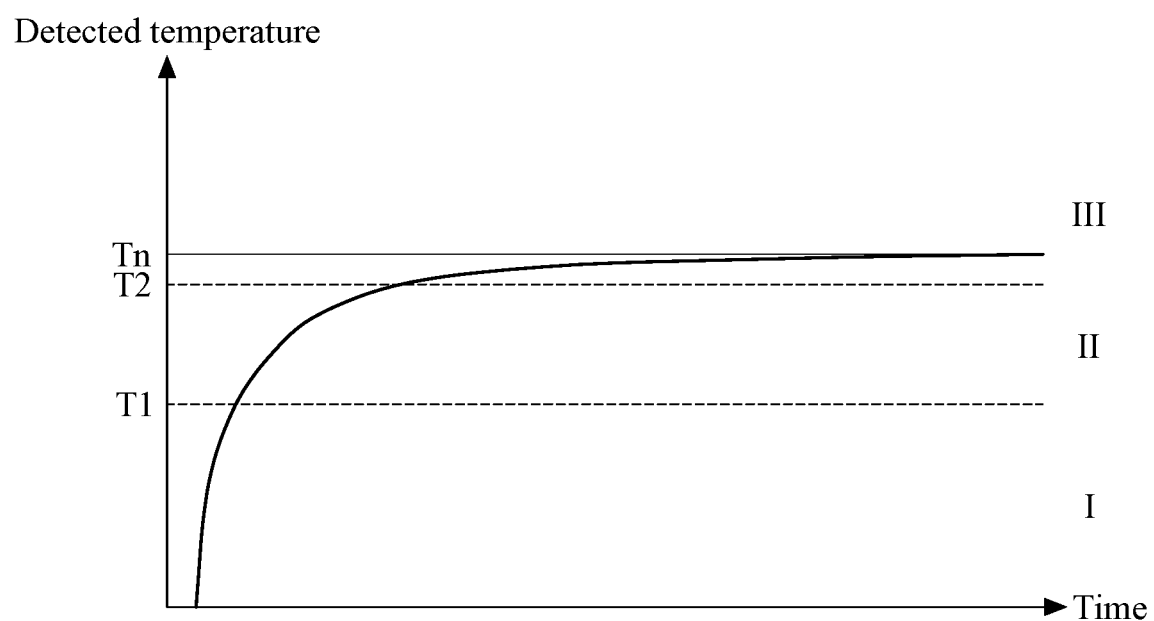
FIG. 4 is a time-temperature diagram of a temperature control device applying a control method according to another embodiment of this disclosure.

Please refer to FIG. 4 for the explanation of the continuous control of the temperature control device, wherein FIG. 4 is a time-temperature diagram of a temperature control device applying a control method according to another embodiment of this disclosure. As shown in FIG. 4, the control method temperature control device includes three stages I, II and III. When the detected temperature is in the temperature range of the stage I (i.e. the detected temperature is lower than the first temperature T1), the PID controller 17 sets all of the control parameters as zero. Because the temperature of the controlled region in this stage is far lower than the target temperature (i.e. threshold temperature), there is no need to drive the fan to drop the temperature. As a result, the purpose of energy saving may be achieved, and the over-cooling caused by the excessive increase of the speed of the fan 11 may also be avoided. Afterwards, when the detected temperature enters the temperature range of the stage II (i.e. the detected temperature is between the first temperature T1 and the second temperature T2), the PID controller 17 sets the control parameters based on the first parameter group so as to avoid the overshoot of the environment temperature or the component temperature due to inadequate control parameters. When the detected temperature enters the temperature range of the stage III (i.e. the detected temperature is equal to or higher than second temperature T2 and approaches the threshold temperature Tn), the PID controller 17 sets the control parameters based on the second parameter group comprising the second parameters, with each of which the value is smaller than the value of the corresponding first parameter in the first parameter group, so as to reduce the variation of the speed of the fan 11 and the oscillation of the speed of the fan 11.

In view of the above description, the temperature control device and the control method thereof provided in this disclosure sets the control parameters of the PID controller based on different parameter groups in different temperature ranges, so as to avoid the over-cooling caused by the excessive increase of the speed of the fan in the transient response period and the overshoot of the environment temperature or the component temperature occurring before entering the steady-state response period, and to reduce the oscillation of the speed of the fan in the steady-state response period.

What is claimed is:

1. A temperature control device, comprising:
   a fan configured to drive airflows for controlling a temperature of a controlled region;
   a temperature sensor disposed in the controlled region and obtaining a detected temperature, with the detected temperature indicating the temperature of the controlled region;
   a modeling circuit obtaining at least one cooling parameter group based on a transfer function; and
   a PID controller connected to the fan, the temperature sensor and the modeling circuit with respect to a temperature threshold so as to approach but not exceed the temperature threshold, controlling the fan based on an initial parameter group when the detected temperature is lower than a first temperature and the temperature threshold, and controlling the fan based on a first parameter group of said at least one cooling parameter group when the detected temperature is equal to or higher than the first temperature and lower than a second temperature as the detected temperature approaches the temperature threshold, and controlling the fan based on a second parameter group of said at least one cooling parameter group for reducing a variation of the speed of the fan when the detected temperature is equal to or higher than the second temperature and the temperature further approaches the temperature threshold;

wherein the initial parameter group comprises a plurality of initial parameters, with a value of each of the plurality of initial parameters equal to a preset value, and wherein the first temperature is 0.63 times as high as the threshold temperature and the second temperature is 97% of the threshold temperature.

2. The temperature control device according to claim 1, configured to control an environment temperature or a component temperature to be lower than the threshold temperature, wherein the temperature sensor obtains the detected temperature according to the environment temperature or the component temperature.

3. The temperature control device according to claim 1, wherein the preset value is zero.

4. The temperature control device according to claim 1, wherein the first parameter group of said at least one cooling parameter group is obtained by the modeling circuit.

5. The temperature control device according to claim 1, wherein the second parameter group of said at least one cooling parameter group is obtained by the modeling circuit, the modeling circuit obtains the second parameter group by performing calculation based on the first parameter group and a preset ratio by the modeling circuit, and the second temperature higher than the first temperature.

6. A control method of a temperature control device, with the temperature control device comprising a PID controller and a fan and configured to control a temperature of a controlled region, and the control method comprising:

obtaining at least one cooling parameter group based on a transfer function;

obtaining a detected temperature indicating the temperature of the controlled region;

setting a plurality of control parameters of the PID controller with respect to a temperature threshold so as to approach but not exceed the temperature threshold based on an initial parameter group to control a speed of the fan when the detected temperature is lower than a first temperature and the temperature threshold, with the initial parameter group comprising a plurality of initial parameters of which a quantity is equal to a quantity of the plurality of control parameters, and a value of each of the plurality of initial parameters equal to a preset value; and setting the plurality of control parameters of the PID controller with respect to the temperature threshold so as to approach but not exceed the temperature threshold based on a first parameter group of said at least one cooling parameter group when the detected temperature is equal to or higher than the first temperature and lower than a second temperature as the detected temperature approaches the temperature threshold;

setting the plurality of control parameters of the PID controller based on a second parameter group of said at least one cooling parameter group for reducing a variation of the speed of the fan when the detected temperature is equal to or higher than the second temperature as the detected temperature approaches the temperature threshold, and wherein the first temperature is 0.63 times as high as the threshold temperature and the second temperature is 97% of the threshold temperature.

7. The control method according to claim 6, wherein the temperature control device is configured to control an environment temperature or a component temperature to be lower than the threshold temperature, the detected temperature is related to the environment temperature or the component temperature.

8. The control method according to claim 6, wherein the preset value is zero.

9. The control method according to claim 6, wherein obtaining said at least one cooling parameter group based on the transfer function comprises:

calculating a first parameter group based on the transfer function; and calculating a second parameter group based on the first parameter and a preset ratio;

wherein the second temperature is higher than the first temperature.

* * * * *